United States Patent
Lee

(10) Patent No.: US 6,838,378 B2
(45) Date of Patent: Jan. 4, 2005

(54) METHOD FOR MANUFACTURING SEMICONDUCTOR DEVICE

(75) Inventor: Sung Joon Lee, Kyoungki-do (KR)

(73) Assignee: Hynix Semiconductor Inc., Ichon (JP)

( * ) Notice: Subject to any disclaimer, the term of this patent is extended or adjusted under 35 U.S.C. 154(b) by 31 days.

(21) Appl. No.: 10/329,679

(22) Filed: Dec. 27, 2002

(65) Prior Publication Data

US 2003/0219974 A1 Nov. 27, 2003

(30) Foreign Application Priority Data

May 24, 2002 (KR) .................. 10-2002-0028995

(51) Int. Cl.[7] .............................................. H01I 21/44
(52) U.S. Cl. ...................................... 438/672; 438/675
(58) Field of Search ................................ 438/240, 243, 438/253, 386, 396, 637, 672, 673, 675, 668, 680, 684, 700, 704, 706, 745, 785

(56) References Cited

U.S. PATENT DOCUMENTS 6,235,572 B1 * 5/2001 Kunitomo et al. .......... 438/240
6,433,381 B2 * 8/2002 Mizutani et al. ............ 257/311
6,611,017 B2 * 8/2003 Hieda ......................... 257/306

* cited by examiner

Primary Examiner—David Nhu
(74) Attorney, Agent, or Firm—Jacobson Holman PLLC

(57) ABSTRACT

The present invention discloses a method for manufacturing a semiconductor device, and in particular to a contact process of metal lines for connecting a local bit line for transmitting signals in an MAT to a new bit line for transmitting signals between the MATs in a layout structure having a bit line switch between the MATs. In the disclosed method, the metal line contact is formed according to the large first metal contact process and the small second metal contact process, and thus the contact hole having a high aspect ratio is formed to have a predetermined size, thereby embodying the hierarchical bit line structure.

8 Claims, 6 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and in particular to a contact process of metal lines for connecting a local bit line for transmitting signals in an MAT to a new bit line for transmitting signals between the MATs in a layout structure having a bit line switch between the MATs, wherein an distance between the metal lines follows 0.1 µm design rule.

2. Description of the Background Art

FIGS. 1a and 1b are plane views schematically illustrating a conventional semiconductor device of 256 k MAT structure for example.

Referring to FIG. 1a, sense amps 13 are positioned at the right and left sides of MATs 11, and sub word line drivers (SWD) 15 are positioned at the top and bottom of the MATs 11.

Here, a bit line (not shown) serves as a local bit line used only for signal transmission. The SWD is one of the elements constituting a DRAM core circuit.

Since a word line is gates of cell transistors, it has a high capacitance. In addition, the word line uses a relatively high resistance material such as polysilicon and polycide, resulting in considerable signals delays.

In order to solve the foregoing problems, a method has been suggested wherein the word line is divided into a long distance word line for transmitting signals between the MATs and a sub word line of a cell array.

The SWD usually refers to a sub word line driver array (SWD array) including a row decoder and a word line driver which are required to drive the sub word line.

For reference, a main word line is composed of a low resistance metal line, and the sub word line is composed of polysilicon or polycide.

FIG. 1b is a plane view schematically illustrating an MAT structure using hierarchical bit lines of FIG. 1a, of 128 k MAT structure.

The MAT refers to a matrix, a unit cell matrix or a sub cell array. Generally a memory cell is arranged in a matrix of $2^M$ columns and $2^N$ rows.

As shown in FIG. 1b, bit line switches 27 are positioned between MATs 21, sense amps 23 are positioned at both ends of the array of the MATs 21, and SWDs 25 are positioned at the top and bottom of the MATs 21.

FIG. 2 is a layout view illustrating a hierarchical bit line structure of FIG. 1b.

As shown in FIG. 2, since the same number of metal lines as bit lines are routed, the pitch of the metal lines is reduced to half of the conventional bit lines.

Therefore, a line/space is 0.10 µm/0.10 µm under 0.10 µm design rule.

In order to prevent short between the bit line and the adjacent metal lines, a size of a contact of the metal lines/bit lines should not exceed a predetermined value. In addition, a size of a contact pattern is determined according to the amount of overlapping between the contact and the bit line and top CD widening in an etching process.

Here, when the amount of overlapping is less than 0.05 µm and an aspect ratio is about 10, a top CD of the contact is laterally widened by 0.025 µm than the size of the pattern during the etching process using a photosensitive film pattern, and thus the size of the contact pattern vertical to the metal line should not exceed 0.10 µm.

In this case, since step difference of the contact is about 2 µm, the aspect ratio is about 20, resulting in etching and plug filling difficulties. Moreover, the top CD is much more widened and short between the bit line and the adjacent metal lines occurs.

FIGS. 3a to 3c are cross-sectional views illustrating a conventional method for manufacturing a semiconductor device, especially a cell region 100 and a peripheral circuit region 200.

Referring to FIG. 3a, an element isolating film (not shown) defining an active region is formed on a semiconductor substrate (not shown). A word line (not shown) is formed in the active region, and a bit lines 31 is formed over the word line.

Although not shown in the drawings, a bit line metal barrier layer (not shown) is formed under the bit line 31, and the bit line 21 has a hard mask layer (not shown) is formed thereon, and an insulating film spacer is formed on the sidewalls thereof.

The formation process of capacitors in the cell region 100 is as follows.

Thereafter, an interlayer insulating film 33 is formed on the entire surface. The interlayer insulating film 33 is planarized according to a planarization etching process to expose a top portion of the bit line 31.

A landing plug 35 for storage electrode is formed by etching the interlayer insulating film 33 between the bit lines 31 according to a landing plug formation process.

An etch barrier film 37 and an insulating film 39 for storage electrode is sequentially on the entire surface of the resulting structure, and then etched them according to a photoetching process using a storage electrode mask (not shown) to form a trench type storage electrode region exposing the landing plug 35.

Thereafter, a conductive layer for storage electrode having a predetermined thickness is formed on the entire surface of the resulting structure, and then etched to form a concave type storage electrode 41 in the trench type storage electrode region.

Next, a dielectric film 43 having a predetermined thickness is formed on the entire surface of the resulting structure. Here, the dielectric film 43 is composed of an insulating material having a high dielectric constant.

A plate electrode 45 is formed on the dielectric film 43, thereby forming capacitors.

An interlayer insulating film 49 planarizing the entire surface is formed on the resulting structure.

The formation process of metal line in the peripheral circuit region 200 is as follows.

An interlayer insulating film 47 planarizing the entire surface of the peripheral circuit region 200 bit line 31 is formed to have the same height as the plate electrode 45. The interlayer insulating film 49 is formed on the interlayer insulating film 47 at the same time as the cell region 100.

Referring to FIG. 3b, a contact hole 51 exposing the bit line 31 of the peripheral circuit region 200 is formed by etching the interlayer insulating films 49 and 47 according to a photoetching process using a metal line mask (not shown).

A metal barrier layer 53 is formed on the surface of the contact hole 51.

A metal line contact plug 55, preferably a tungsten layer, is formed to fill the contact hole 51.

Referring to FIG. 3c, a metal line 57 is formed to contact the bit line 31 through the contact plug 55.

Here, the metal line 57 is composed of aluminum alloy or copper.

As described above, the conventional method for manufacturing the semiconductor device has disadvantages in that the aspect ratio reaches 10 in the contact etching process and a thickness of the photosensitive film cannot be increased over a predetermined value, for example 0.86 µm under 0.19 µm design rule due to difficulties in the patterning process, and thus the top CD widening of the contact hole occurs due to a small thickness margin of the photosensitive film. As a result, it is difficult to manufacture the device in a predetermined size, which deteriorates a property of the device.

SUMMARY OF THE INVENTION

Accordingly, it is an object of the present invention to provide a method for manufacturing a semiconductor device of an MAT structure having hierarchical bit lines by simplifying a manufacturing process of the device having a high aspect ratio according to two contact processes for obtaining a sufficient contact margin.

In order to achieve the above-described object of the invention, there is provided a method for manufacturing a semiconductor device, including the steps of: (a) preparing a semiconductor substrate having a cell region and a peripheral circuit region, the cell region being provided with a first bit line, a storage electrode contact to the first bit line and a dielectric film formed on the storage electrode, the peripheral circuit region being provided with a second bit line and a first insulating film formed on the entire surface of the peripheral circuit region; (b) depositing and patterning a conducting material on the resultant structure to form a plate electrode in the cell region and a contact pad above the second bit line in the peripheral region, the contact pad being electrically isolated from the plate electrode; (c) etching a predetermined region of the contact pad and the first insulating film therebelow to form a first contact hole exposing a top portion of the bit line in the peripheral circuit region; (d) forming a first contact plug filling the first contact hole with a conductive material; (e) forming a second interlayer insulating film on the entire surface of the resulting structure; (f) etching a predetermined region of the second interlayer insulating film to form a second contact hole exposing the contact pad; and (g) forming a second contact plug by filling the second contact hole with a conductive material, and forming a metal line electrically connected to the second contact plug, wherein the contact pad comprises one of TiN and TiN/W stacked layer, the contact pad has a thickness ranging from 1000 to 2000 Å, the interlayer insulating film is comprises a silicon oxide film having a thickness ranging from 2000 to 4000 Å, a size of the second contact hole ranges from ⅖ to ⅗ of a size of the first contact hole in size, a pitch of the metal line formed in the cell region is substantially identical to a pitch of the first bit line, and the second contact plug and the metal line are formed simultaneously.

The principle of the present invention will now be explained.

An MAT structure is formed by using hierarchical bit lines, and two contact etching processes are performed to obtain a contact margin of a metal line for connecting a local bit line to a global bit line.

In more detail, a first contact etching process patterns in a size under a design rule, and a second contact etching process patterns according to the pitch of the metal line identical to the pitch of the bit line, thereby embodying the hierarchical bit line structure.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing a semiconductor device in accordance with a preferred embodiment of the present invention will now be described in detail with reference to the accompanying drawings.

FIGS. 4a to 4d are cross-sectional views illustrating the method for manufacturing the semiconductor device in accordance with the preferred embodiment of the present invention, wherein a cell region 300 and a peripheral circuit region 400 is illustrated.

Figure 1A:
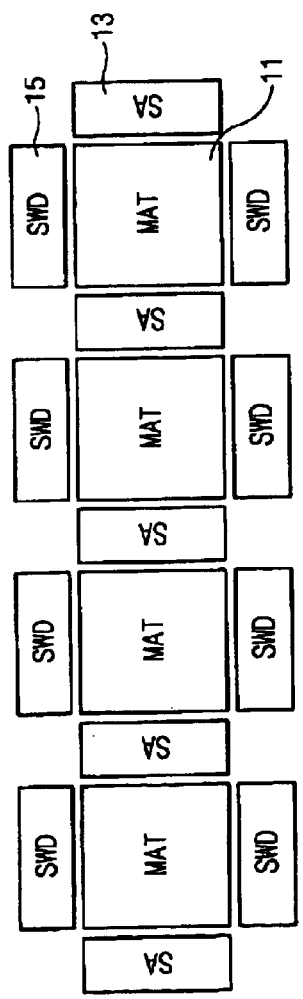
FIGS. 1a and 1b are plan views illustrating a conventional method for manufacturing a semiconductor device.
Figure 1B:
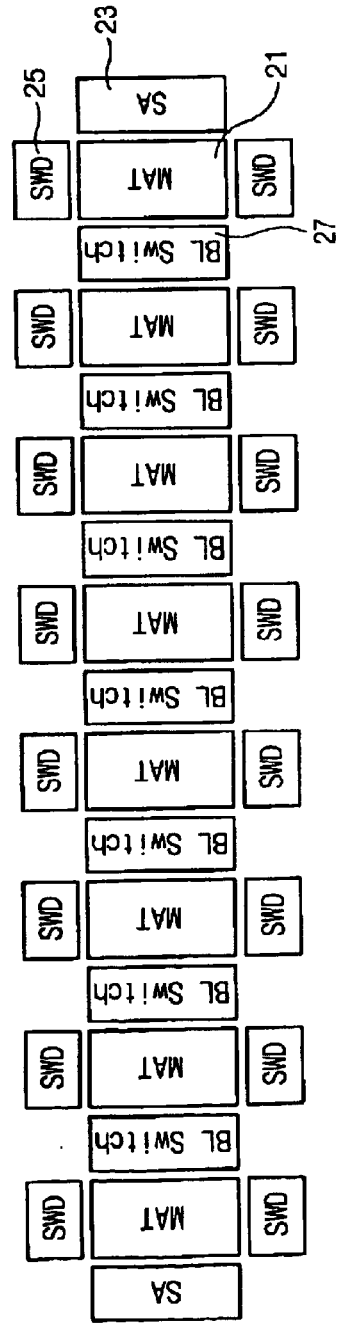
Figure 2:
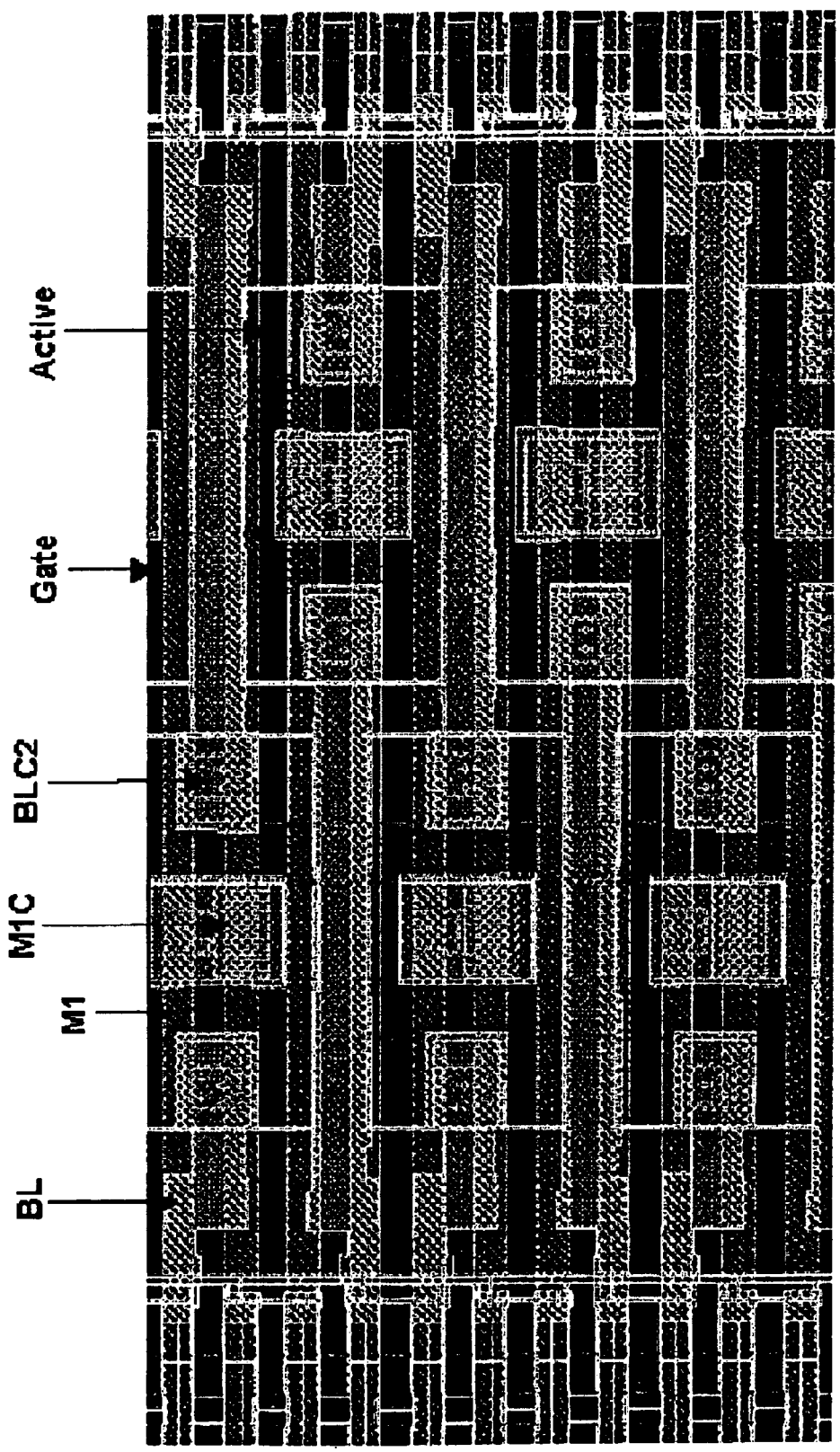
FIG. 2 is a layout view illustrating the conventional semiconductor device.
Figure 3A:
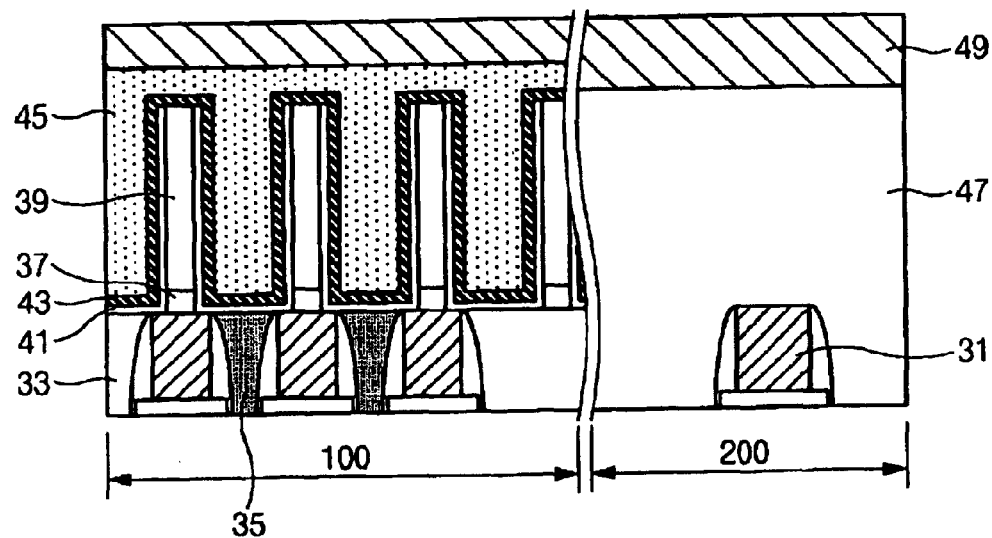
FIGS. 3a to 3c are cross-sectional views illustrating the conventional method for manufacturing the semiconductor device.
Figure 3B:
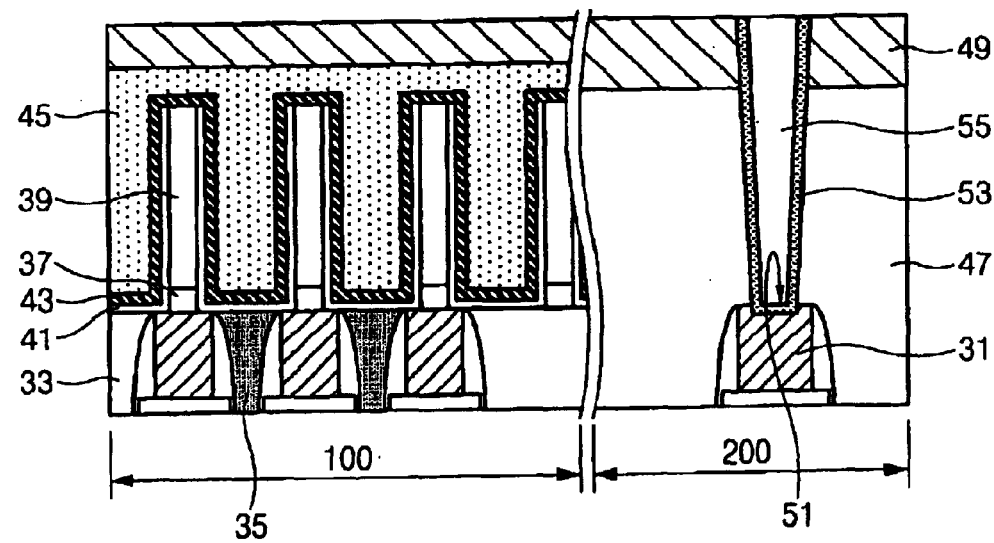
Figure 3C:
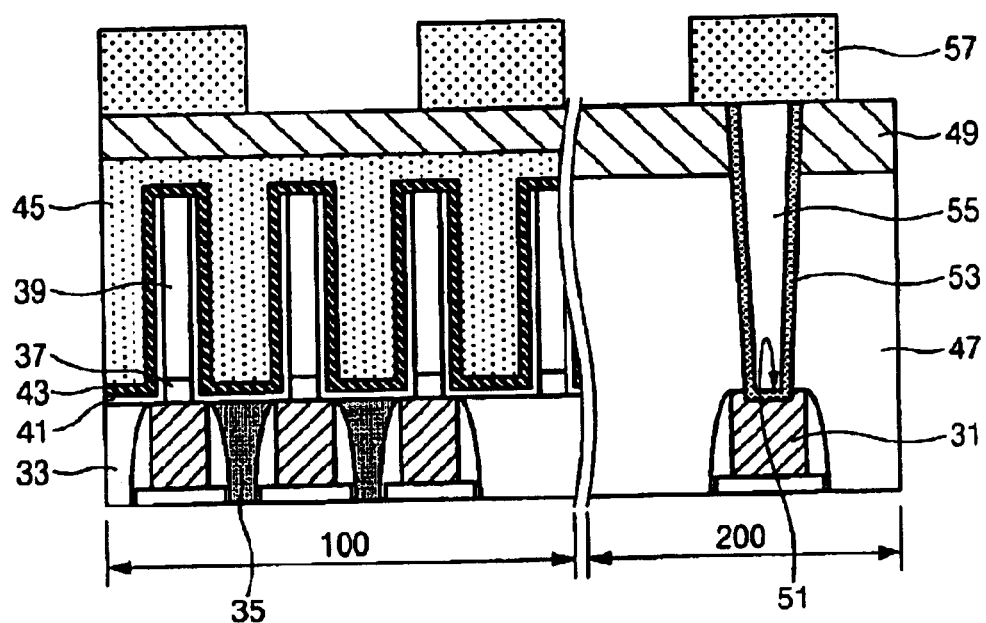
Figure 4A:
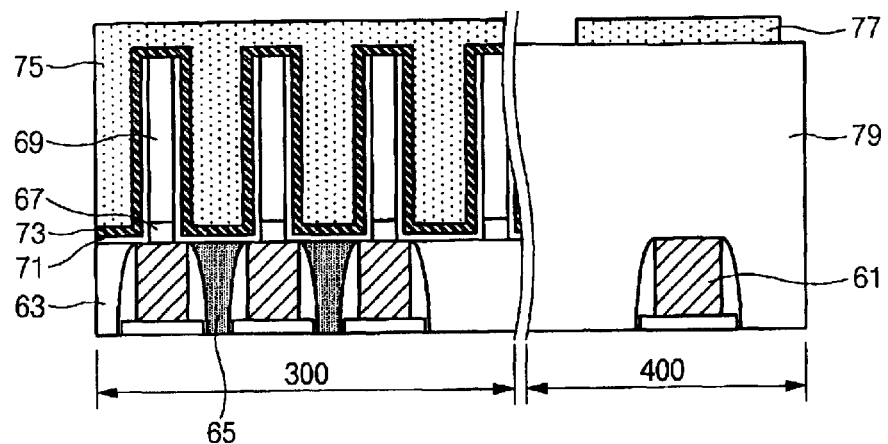
FIGS. 4a to 4d are cross-sectional views illustrating a method for manufacturing a semiconductor device in accordance with a preferred embodiment of the present invention.

Referring to FIG. 4a, an element isolating film (not shown) defining an active region is formed on a semiconductor substrate (not shown).

A word line (not shown) is formed in the active region, and a bit line 61 is formed over the word line.

Although not shown in the drawings, a bit line metal barrier layer (not shown) is formed under the bit line 61, and the bit line 61 has a hard mask layer (not shown) is formed thereon, and an insulating film spacer is formed on the sidewalls thereof.

The formation process of capacitors in the cell region 300 is as follows.

Thereafter, an interlayer insulating film 63 is formed on the entire surface. The interlayer insulating film 63 is planarized according to a planarization etching process to expose a top portion of the bit line 61.

A landing plug 65 for storage electrode is formed by etching the interlayer insulating film 63 between the bit lines 61 according to a landing plug formation process.

An etch barrier film 67 and an insulating film 69 for storage electrode is sequentially deposited on the entire surface of the resulting structure, and then etched according to a photoetching process using a storage electrode mask (not shown) to form a trench type a storage electrode region exposing the landing plug 65.

Thereafter, a conductive layer for storage electrode having a predetermined thickness is formed on the entire surface of the resulting structure, and then etched to form a concave type storage electrode 71 in the trench type storage electrode region.

Next, a dielectric film 73 having a predetermined thickness is formed on the entire surface of the resulting structure. Here, the dielectric film 73 is composed of an insulating material having a high dielectric constant.

A plate electrode 75 is formed on the dielectric film 73, thereby forming capacitors.

Here, a contact pad 77 is formed on the interlayer insulating film 79 of the peripheral circuit region 400 during the formation process of the plate electrode 75.

The contact pad 77 is electrically isolated from the plate electrode 75.

Preferably, the plate electrode 75 and the contact pad 77 are composed of TiN or TiN/W stacked layer having a thickness of 1000 to 2000 Å.

Figure 4B:
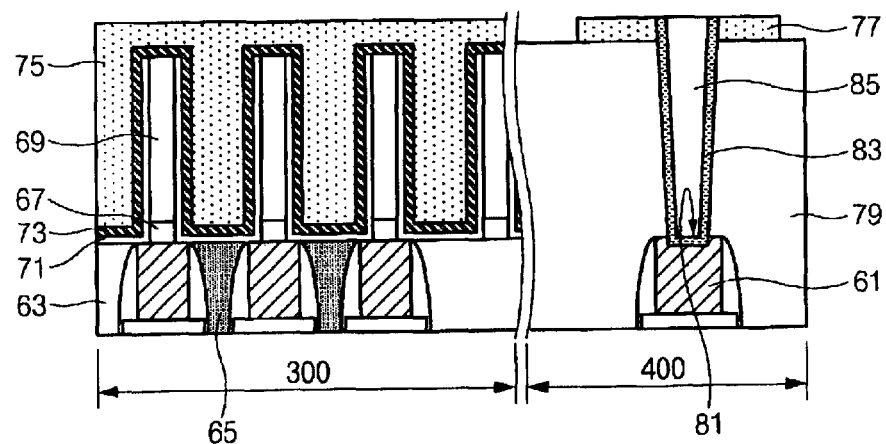

Referring to FIG. 4b, a contact hole 81 exposing the bit line 61 of the peripheral circuit region 400 is formed by etching the contact pad 77 and the interlayer insulating film 79 according to a photoetching process using a first contact mask (not shown).

A metal barrier layer 83 is formed on the surface of the first contact hole 81, and then a first contact plug 85 filling the first contact hole 81 is formed. Preferably, the first contact plug 85 comprises a tungsten.

In addition, the first contact plug 85 may be formed of a conductive layer comprising a high conductivity metal such as aluminum and copper.

Figure 4C:
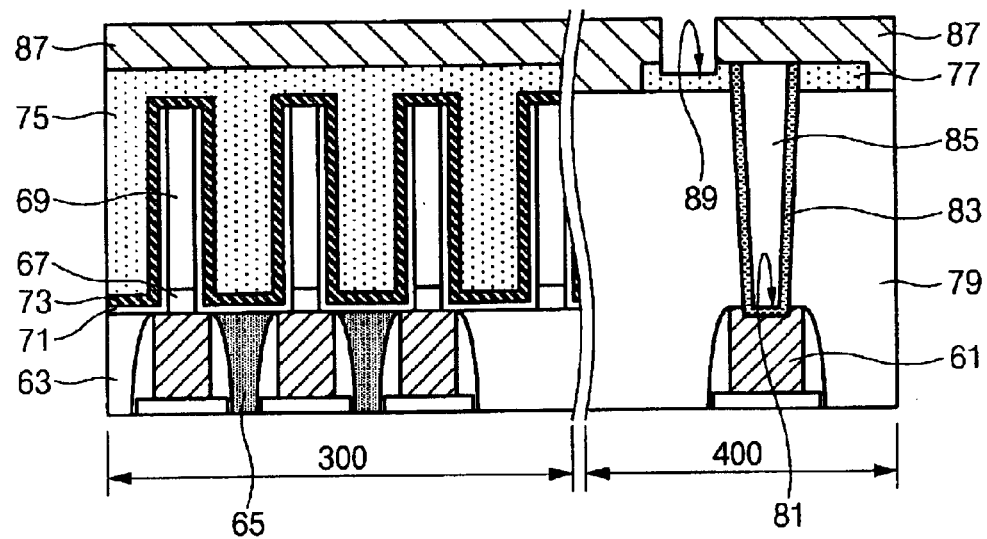

Referring to FIG. 4c, an interlayer insulating film 87 is formed on the entire surface of the resulting structure by using a silicon oxide film having a thickness ranging from 2000 to 4000 Å, and then etched according to a photoetching process using a second contact mask (not shown) to form a second contact hole 89 exposing the contact pad 77.

Here, the second contact hole 89 is smaller than the first contact hole 81 according to a pitch of the metal line which is identical to a pitch of the bit line. Preferably, the second contact hole 89 is 2/5 to 3/5 of the first contact hole 81 in size.

Figure 4D:
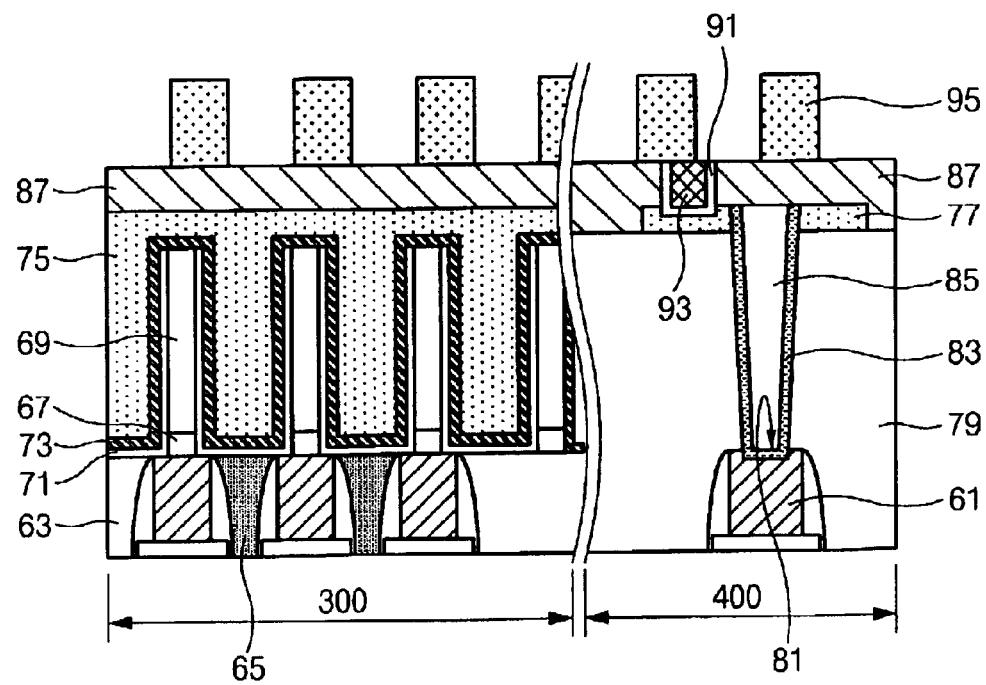

Referring to FIG. 4d, a metal barrier layer 91 is deposited on the surface of the second contact hole 89, and then a second contact plug 93 for filling the second contact hole 89 is formed.

Here, the second contact plug 93 is composed of the same material as the first contact plug 85.

Thereafter, a metal line 95 is formed to contact the second contact plug 93.

Here, the metal line 95 contacts the bit line 61 through the second contact plug 93 and the first contact plug 85.

In addition, the metal line 95 and the second contact plug 93 may be formed at the same time.

As discussed earlier, in accordance with the present invention, the metal line contact is formed according to the large first metal contact process and the small second metal contact process under the design rule, and thus the contact hole having a high aspect ratio is formed to have a predetermined size, thereby embodying the hierarchical bit line structure and improving cell efficiency.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing a semiconductor device, comprising the steps of:

(a) preparing a semiconductor substrate having a cell region and a peripheral circuit region, the cell region and the peripheral circuit region being provided with a bit line, wherein the cell region is further provided with a storage electrode contact contacting the bit line in the cell region, a storage electrode contacting the storage electrode contact and a dielectric film formed on the storage electrode, and wherein the peripheral circuit region is further provided with a first interlayer insulating film formed on the semiconductor substrate;

(b) depositing and patterning a conducting material on the dielectric film and the first interlayer insulating film to simultaneously form a plate electrode in the cell region and a contact pad above the bit line in the peripheral circuit region, the contact pad being electrically isolated from the plate electrode;

(c) etching a predetermined region of the contact pad and the first interlayer insulating film therebelow to form a first contact hole exposing a top portion of the bit line in the peripheral circuit region;

(d) forming a first contact plug filling the first contact hole with a conductive material;

(e) forming a second interlayer insulating film covering the cell region and the peripheral circuit region;

(f) etching a predetermined region of the second interlayer insulating film to form a second contact hole exposing the contact pad; and (g) forming a second contact plug by filling the second contact hole with a conductive material, and forming a metal line electrically connected to the second contact plug.

2. The method according to claim 1, wherein the contact pad comprises one of TiN and TiN/W stacked layer.

3. The method according to claim 1, wherein the contact pad has a thickness ranging from 1000 to 2000 Å.

4. The method according to claim 1, wherein the interlayer insulating film of step (e) has a silicon oxide film at a thickness ranging from 2000 to 4000 Å.

5. A method for manufacturing a semiconductor device, comprising the steps of:

(a) preparing a semiconductor substrate having a cell region and a peripheral circuit region, the cell region and the peripheral circuit region being provided with a bit line, wherein the cell region is further provided with a storage electrode contact contacting the bit line in the cell region, a storage electrode contacting the storage electrode contact and a dielectric film formed on the storage electrode, and wherein the peripheral circuit region is further provided with a first interlayer insulating film formed on the semiconductor substrate;

(b) depositing and patterning a conducting material on the dielectric film and the first interlayer insulating film to form a plate electrode in the cell region and a contact pad above the bit line in the peripheral circuit region, the contact pad being electrically isolated from the plate electrode;

(c) etching a predetermined region of the contact pad and the first interlayer insulating film therebelow to form a first contact hole exposing a top portion of the bit line in the peripheral circuit region;

(d) forming a first contact plug filling the first contact hole with a conductive material;

(e) forming a second interlayer insulating film covering the cell region and the peripheral circuit region;

(f) etching a predetermined region of the second interlayer insulating film to form a second contact hole exposing the contact pad, wherein a size of the second contact hole ranges from 2/5 to 3/5 of that of the first contact hole in size; and (g) forming a second contact plug by filling the second contact hole with a conductive material, and forming a metal line electrically connected to the second contact plug.

6. The method according to claim 1, wherein a pitch of the metal line formed in the cell region is substantially identical to a pitch of the first bit line.

7. The method according to claim 1, wherein the second contact plug and the metal line are formed simultaneously.

8. The method according to claim 5, wherein the plate electrode and the contact pad are formed simultaneously.

* * * * *